United States Patent
Jeong

(10) Patent No.: US 8,450,762 B2
(45) Date of Patent: May 28, 2013

(54) LIGHT EMITTING DEVICE

(75) Inventor: Hwan Hee Jeong, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/453,531

(22) Filed: Apr. 23, 2012

(65) Prior Publication Data

US 2012/0205711 A1 Aug. 16, 2012

Related U.S. Application Data

(63) Continuation of application No. 13/014,082, filed on Jan. 26, 2011, now abandoned.

(30) Foreign Application Priority Data

Feb. 4, 2010 (KR) .................. 10-2010-0010246

(51) Int. Cl.
*H01L 33/00* (2010.01)

(52) U.S. Cl.
USPC .. 257/98; 257/99; 257/E33.066; 257/E33.074

(58) Field of Classification Search
USPC ................ 257/98, 99, E33.066, E33.074
See application file for complete search history.

(56) References Cited

U.S. PATENT DOCUMENTS

| | | | |
|---|---|---|---|
| 7,375,380 B2 | 5/2008 | Asahara et al. | ............ 257/98 |
| 2006/0273335 A1 | 12/2006 | Asahara et al. | |
| 2008/0210955 A1 | 9/2008 | Uemura et al. | |
| 2009/0261370 A1 | 10/2009 | Jeong | |
| 2009/0309514 A1* | 12/2009 | Kim | ............ 315/291 |
| 2010/0019264 A1 | 1/2010 | Jeong | |
| 2011/0001145 A1 | 1/2011 | Park | |

FOREIGN PATENT DOCUMENTS

| | | |
|---|---|---|
| CN | 1820378 A | 8/2006 |
| CN | 101335313 A | 12/2008 |
| KR | 10-2005-0070459 A | 7/2005 |
| KR | 10-2006-0062715 | 6/2006 |
| KR | 10-2009-0075076 A | 7/2009 |
| KR | 10-2010-0011116 A | 2/2010 |

OTHER PUBLICATIONS

Korean Decision to Grant a Patent dated Jul. 21, 2010 issued in Application No. 10-2010-0010246.
U.S. Office Action for U.S. Appl. No. 13/014,080 dated Sep. 2, 2011.
U.S. Office Action for U.S. Appl. No. 13/014,080 dated Jan. 3, 2012.
Chinese Office Action dated Oct. 16, 2012 issued in Application No. 201110036028.7.

* cited by examiner

*Primary Examiner* — Julio J Maldonado
*Assistant Examiner* — Amar Movva
(74) *Attorney, Agent, or Firm* — KED & Associates LLP

(57) ABSTRACT

Disclosed are a light emitting device, a method of manufacturing the same, a light emitting device package, and a lighting system. The light emitting device includes the light emitting structure layer including a first conductive semiconductor layer, a second conductive semiconductor layer, and an active layer between the first and second conductive semiconductor layers, a conductive support substrate electrically connected to the second conductive semiconductor layer, a contact electrically connected to the first conductive semiconductor layer, a dielectric material making contact with the contact and interposed between the contact and the conductive support substrate, and an insulating layer electrically insulating the contact from the active layer, the second conductive semiconductor layer, and the conductive support substrate.

18 Claims, 16 Drawing Sheets

LIGHT EMITTING DEVICE

CROSS-REFERENCE TO RELATED APPLICATION

This application is a continuation of U.S. application Ser. No. 13/014,080 filed on Jan. 26, 2011 now abandoned claiming the benefit of Korean Patent Application No. 10-2010-0010246 filed on Feb. 4, 2010, both of which are hereby incorporated by reference for all purpose as if fully set forth herein.

The embodiment relates to a light emitting device, a method of manufacturing the same, and a light emitting device package.

Light emitting diodes (LEDs) are a kind of semiconductor devices that convert electric energy into light. The LED is advantageous as compared with conventional light sources, such as a fluorescent lamp or a glow lamp, in terms of power consumption, life span, response speed, safety and environmental-friendly requirement.

In this regard, various studies have been performed to replace the conventional light sources with the LEDs. The LEDs are increasingly used as light sources for lighting devices such as various lamps used, liquid crystal displays, electric signboards, and street lamps.

SUMMARY

The embodiment provides a light emitting device having a novel structure, a method of manufacturing the same, a light emitting device package, and a lighting system.

The embodiment provides a light emitting device capable of representing superior electrical stability, a method of manufacturing the same, a light emitting device package, and a lighting system.

The embodiment provides a light emitting device capable of reducing the damage caused by ESD (Electro-Static Discharge), a method of manufacturing the same, and a light emitting device package.

According to the embodiment, a light emitting device includes a light emitting structure layer including a first conductive semiconductor layer, a second conductive semiconductor layer, and an active layer between the first and second conductive semiconductor layers, a conductive support substrate electrically connected to the second conductive semiconductor layer, a contact electrically connected to the first conductive semiconductor layer, a dielectric material making contact with the contact and interposed between the contact and the conductive support substrate, and an insulating layer electrically insulating the contact from the active layer, the second conductive semiconductor layer, and the conductive support substrate.

According to the embodiment, a method of forming a light emitting device including forming a light emitting structure layer including a first conductive semiconductor layer, an active layer, and a second conductive semiconductor layer, forming a recess part by selectively removing the first conductive semiconductor layer, the active layer, and the second conductive semiconductor layer such that the first conductive semiconductor layer is exposed, forming a first insulating layer in such a manner that the first conductive semiconductor layer is partially exposed in the recess part, the first insulating layer covering the active layer, forming a contact making contact with the first conductive semiconductor layer and the first insulating layer in the recess part, forming a dielectric material on the contact, and forming a conductive support substrate connected to the dielectric material.

According to the embodiment, the light emitting device package includes a light emitting device claimed according to one of claims 1 to 13 and a package body including the light emitting device.

According to the embodiment, a lighting system employs the light emitting device as a light source. The lighting system includes a substrate and a light emitting module including at least one light emitting device mounted on the substrate. The light emitting device is disclosed in one of claims 1 to 13.

DETAILED DESCRIPTION OF THE EMBODIMENTS

Figure 1:
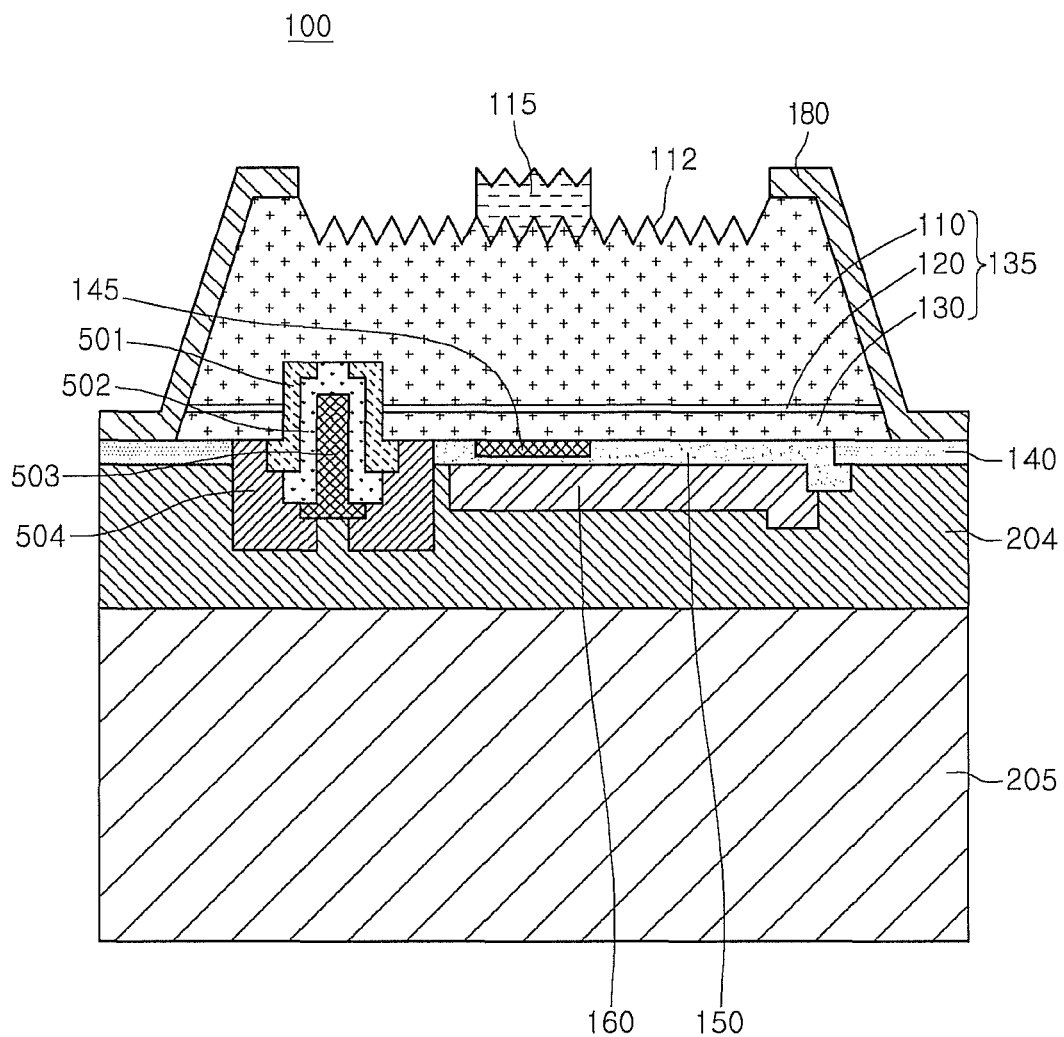
FIG. 1 is a view showing a light emitting device according to the embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, a light emitting device 100, a method of manufacturing the same, a light emitting device package 600, and a lighting system according to the embodiment will be described with reference to accompanying drawings.

FIG. 1 is a view used to explain the light emitting device according to the embodiment.

Referring to FIG. 1, the light emitting device 100 according to the embodiment includes a conductive support substrate 205, an adhesive layer 204 on the conductive support substrate 205, a reflective layer 160 on the adhesive layer 204, an ohmic contact layer 150 on the reflective layer 160, a protective layer 140 at an outer peripheral portion of a top surface of the adhesive layer 204, a light emitting structure layer 135 formed on the ohmic contact layer 150 and the protective layer 140 to generate light, a passivation layer 180 to protect the light emitting structure layer 135, a current blocking layer 145 between the reflective layer 160 and the light emitting structure layer 135, and an electrode unit 115 on the light emitting structure layer 135.

The light emitting structure layer 135 includes a first conductive semiconductor layer 110, a second conductive semiconductor layer 130, and an active layer 120 between the first and second conductive semiconductor layers 110 and 130.

In addition, the light emitting device 100 according to the embodiment may include a capacitor structure including a first insulating layer 501, a second insulating layer 504, a contact 502, and a dielectric material 503.

The dielectric material 503 is formed below the contact 502, and interposed between the contact 502 and the adhesive layer 204. In addition, the dielectric material 503 is interposed between the contact 502 and the conductive support substrate 205.

A top surface of the dielectric material 503 may make contact with the contact 502. At least a part of lateral surfaces of the dielectric material 503 is surrounded by the contact 502. Accordingly, the contact area between the contact 502 and the dielectric material 503 may be increased.

Figure 25:
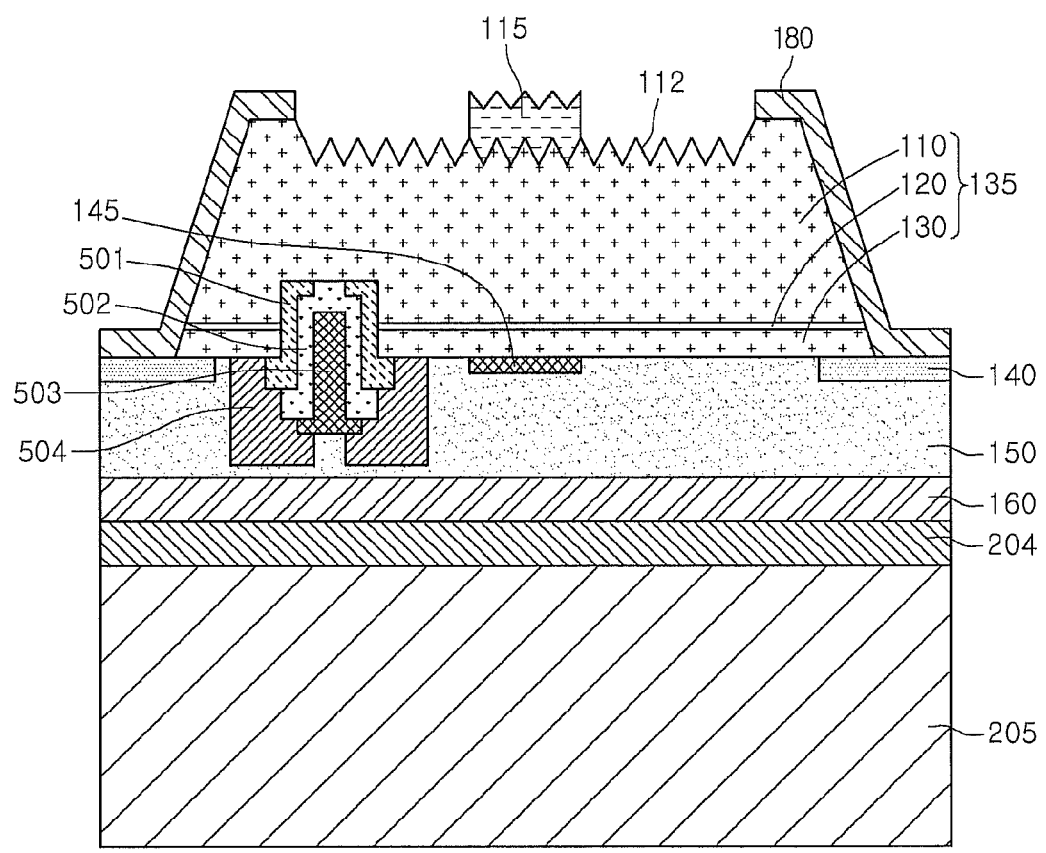
FIG. 25 is a view showing a light emitting device according to still yet another embodiment.
Figure 26:
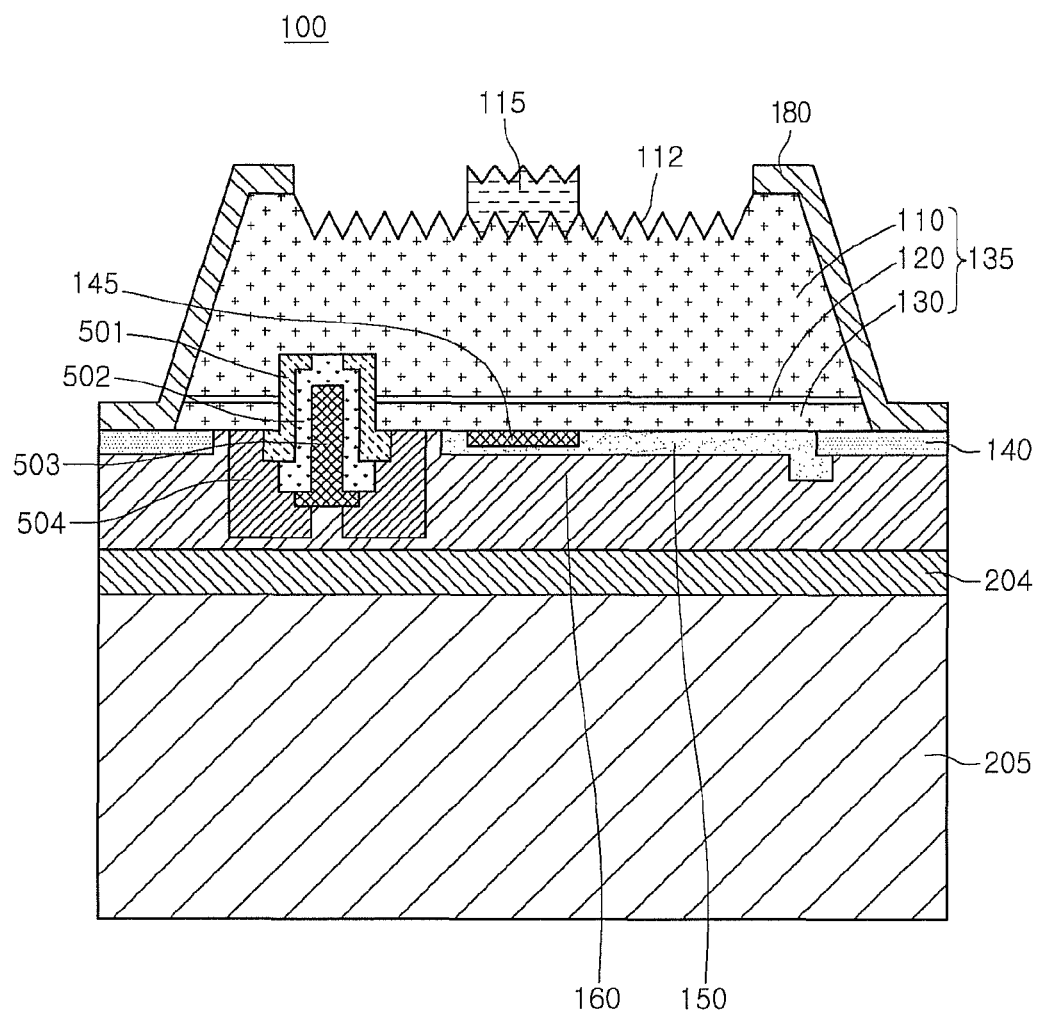
FIG. 26 is a view showing a light emitting device according to still yet another embodiment.

A bottom surface of the dielectric material 503 may make contact with the adhesive layer 204. However, similarly to the structure of the light emitting device 100 of FIG. 25 or FIG. 26 according to another embodiment, the bottom surface of the dielectric material 503 may make contact with the ohmic contact layer 150 or the reflective layer 160.

An insulating layer including the first and second insulating layers 501 and 504 surround the lateral surfaces of the contact 502 and electrically insulate the contact 502 from the active layer 120 and the second conductive semiconductor layer 130.

According to the embodiment, the first insulating layer 501 electrically insulates the contact 502 from the active layer 120 and the second conductive semiconductor layer 130, and the second insulating layer 504 electrically insulates the contract 502 from the ohmic contact layer 150, the reflective layer 160, the adhesive layer 204, and the conductive support substrate 205.

Figure 20:
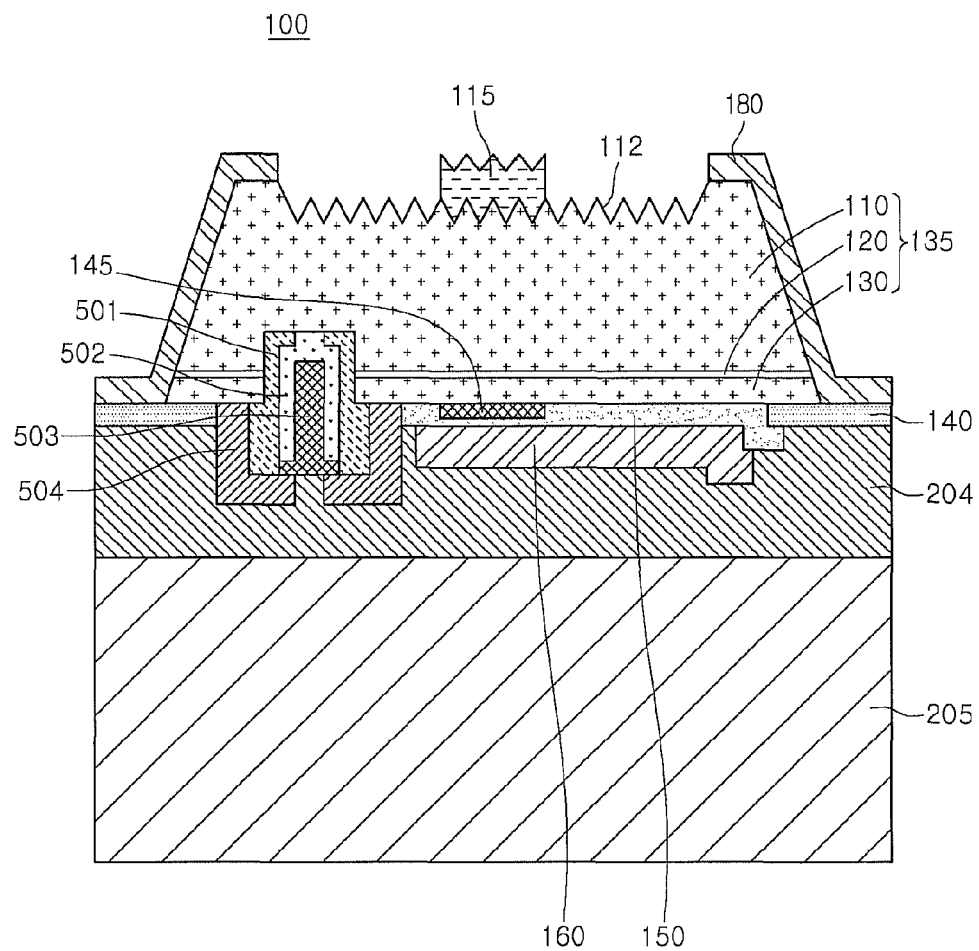
FIG. 20 is a view showing a light emitting device according to another embodiment.

Inner surfaces of the first insulating layer 501 may make contact with the contact 502 and the dielectric material 503. According to the embodiment, the inner surfaces of the first insulating layer 501 make contact with the contact 502. However, similarly to the structure of the light emitting device 100 of FIG. 20 according to another embodiment, the inner surfaces of the first insulating layer 501 may make contact with the dielectric material 503 by changing the structure of the contact 502 and the dielectric material 503.

Figure 21:
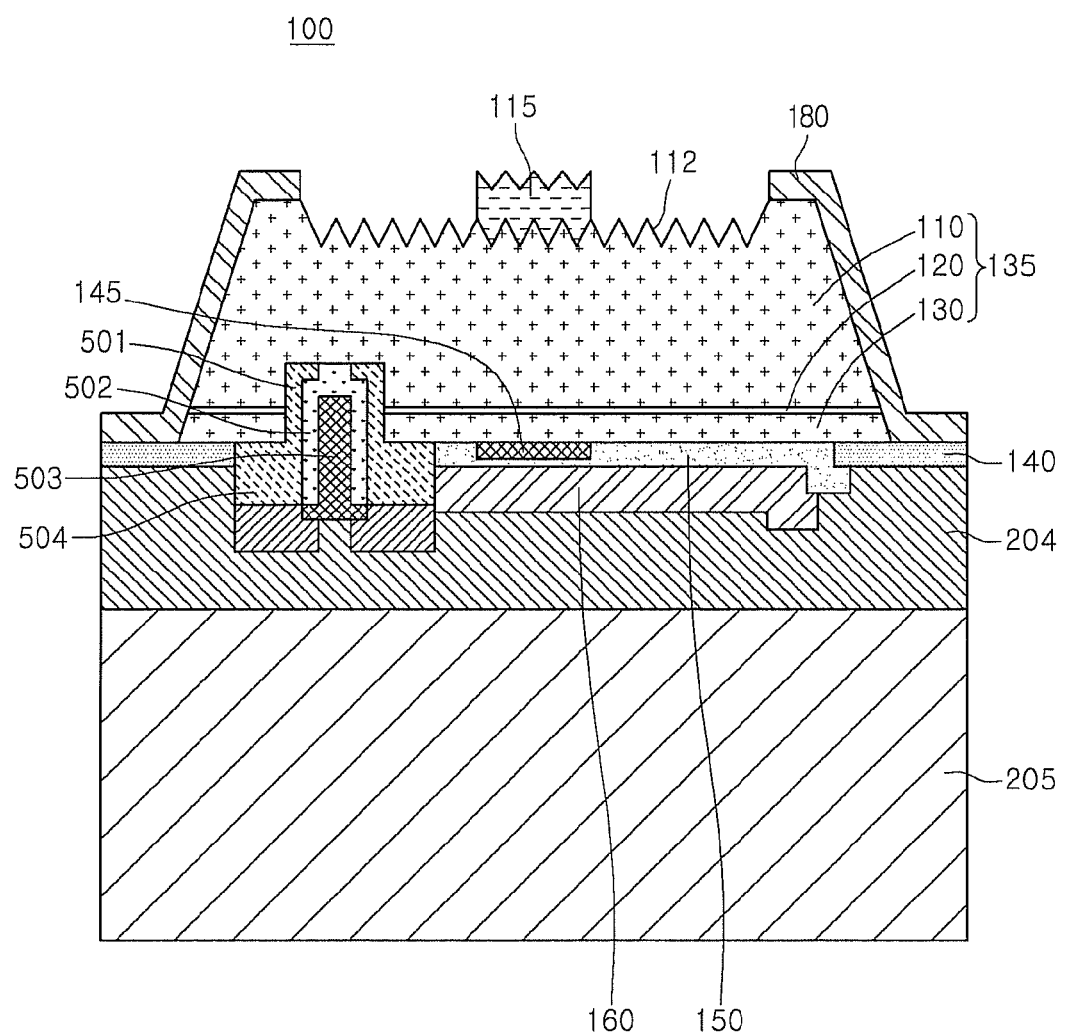
FIG. 21 is a view showing a light emitting device according to still another embodiment.

Outer surfaces of the first insulating layer 501 make contact with the first conductive semiconductor layer 110, the second conductive semiconductor layer 130, the active layer 120, and the second insulating layer 504. Although the outer surfaces of the first insulating layer 501 make contact with the first conductive semiconductor layer 110, the second conductive semiconductor layer 130, the active layer 120, and the second insulating layer 504 according to the embodiment, the outer surfaces of the first insulating layer 501 may make contact with the ohmic contact layer 150 and/or the reflective layer 160 by changing the structure of the second insulating layer 504, the ohmic contact layer 150, and the reflective layer 160 similarly to the structure of the light emitting device 100 of FIG. 21 according to still another embodiment.

Figure 22:
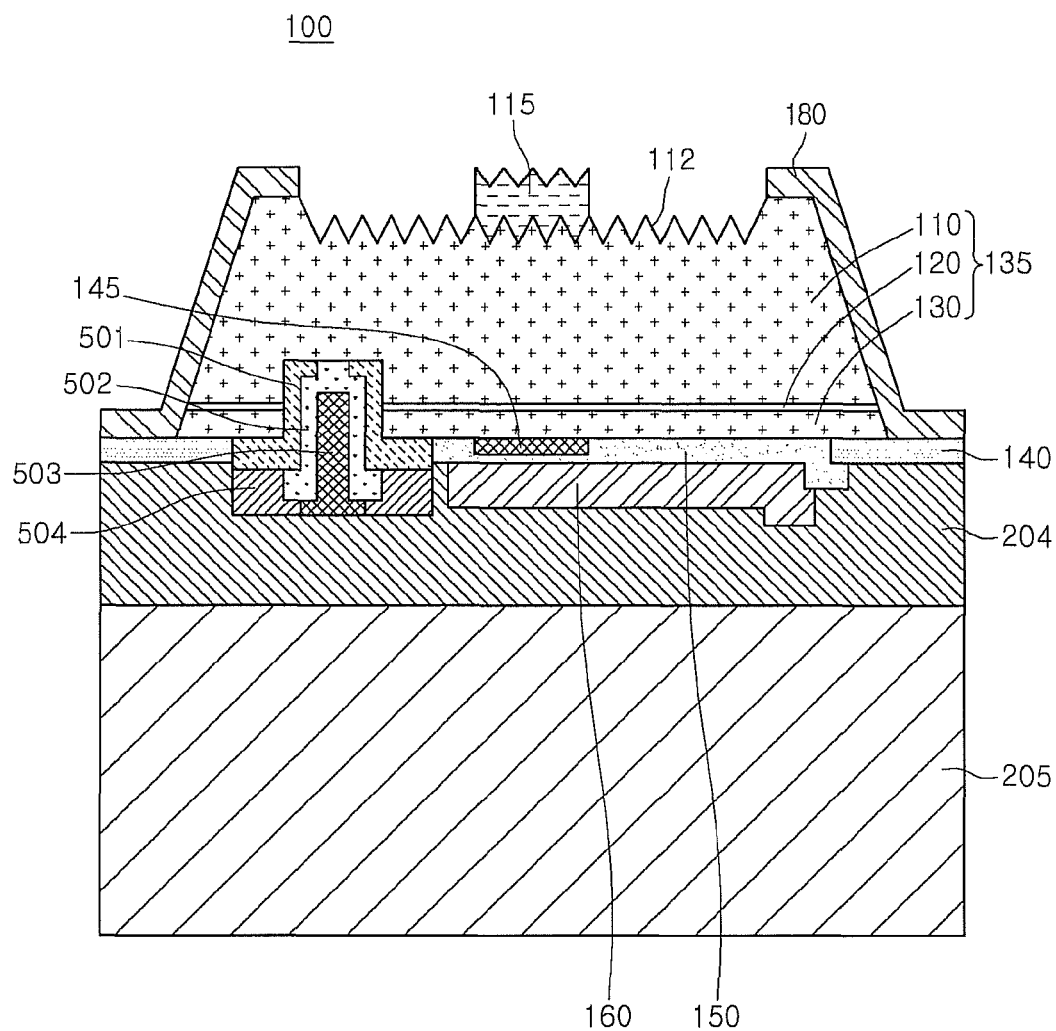
FIG. 22 is a view showing a light emitting device according to still yet another embodiment.
Figure 23:
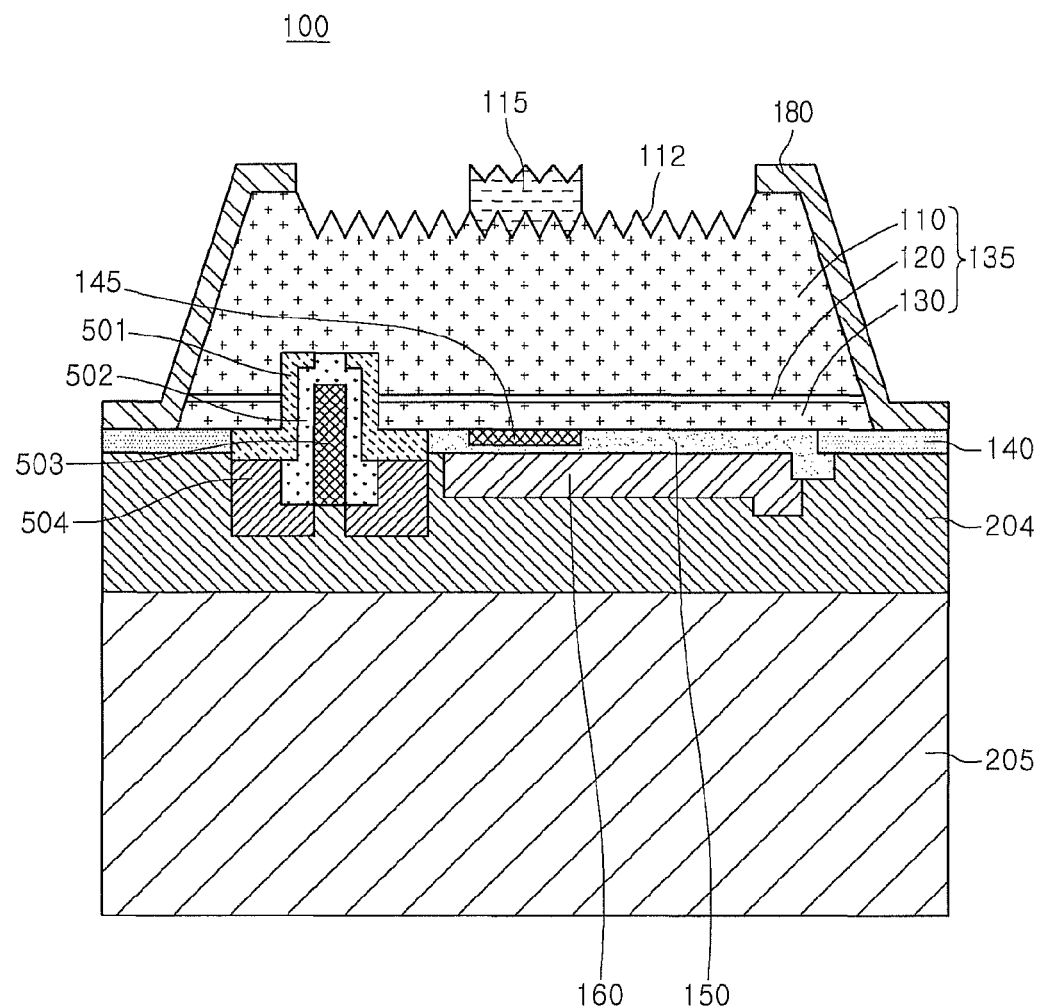
FIG. 23 is a view showing a light emitting device according to still yet another embodiment.

Inner surfaces of the second insulating layer 504 make contact with the first insulating layer 501, the contact 502, the dielectric material 503, and the adhesive layer 204. Although the inner surfaces of the second insulating layer 504 make contact with the first insulating layer 501, the contact 502, the dielectric material 503, and the adhesive layer 204 according to the embodiment, the inner surfaces of the second insulating layer 504 may make contact with only the dielectric material 503 or the adhesive layer 204 together with the contact 502 by changing the structure of the first insulating layer 501, the contact 502, the dielectric material 503, and the adhesive layer 204 similarly to light emitting devices 100 of FIGS. 22 and 23.

Figure 24:
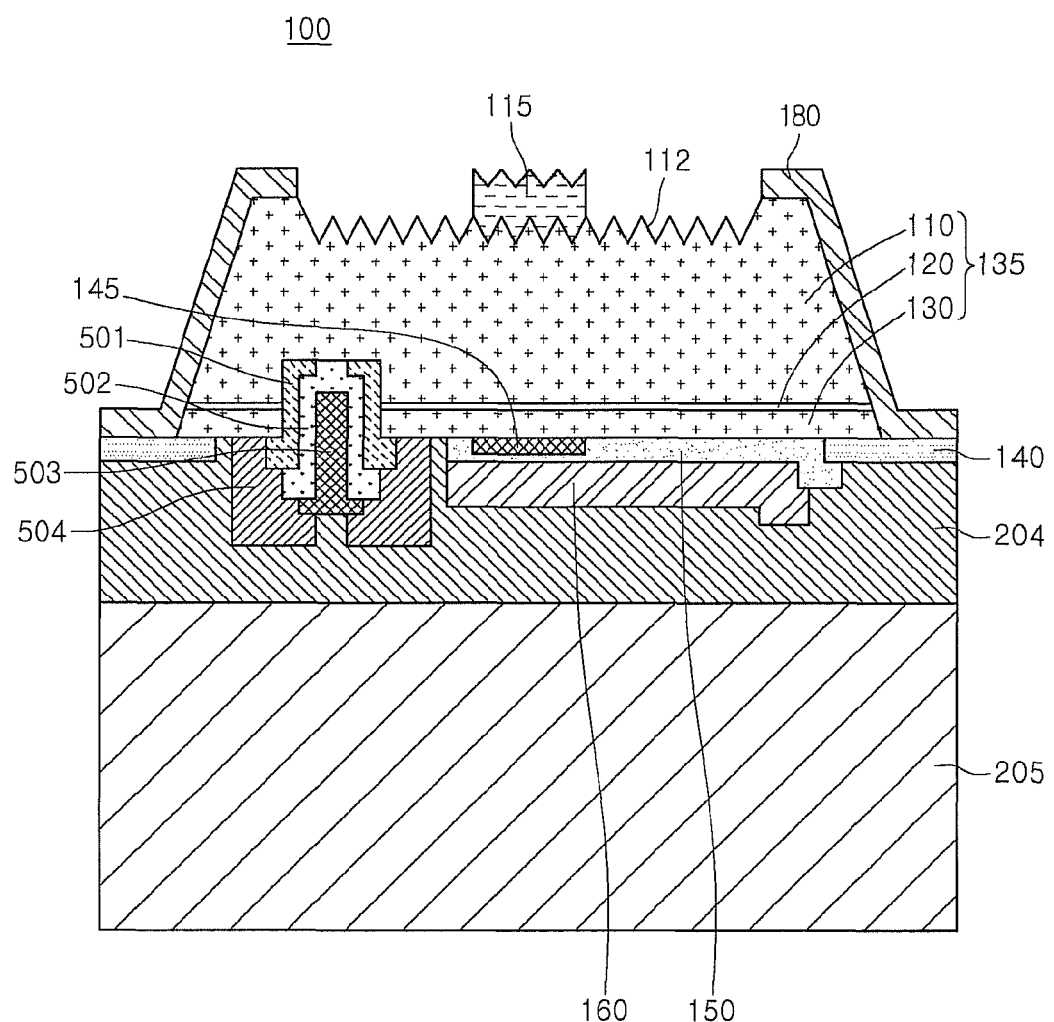
FIG. 24 is a view showing a light emitting device according to still yet another embodiment.

Outer surfaces of the second insulating layer 504 make contact with the adhesive layer 204, the protective layer 140, and the ohmic contact layer 150. Although the outer surfaces of the second insulating layer 504 make contact with the adhesive layer 204, the protective layer 140, and the ohmic contact layer 150 according to the embodiment, the outer surfaces of the second insulating layer 504 may make contact with only the adhesive layer 204 by changing the structure of the adhesive layer 204, the protective layer 140, the ohmic contact layer 150, and the reflective layer 160 similarly to the structure of the light emitting device 100 of FIG. 24 according to still another embodiment, and may make contact with the reflective layer 160 similarly to the structure of the light emitting device 100 of FIG. 21 according to still yet another embodiment.

The insulating layer including the first and second insulating layers 501 and 504 may include a material having electrical conductivity. For example, the insulating layer may include at least one selected from the group consisting of $SiO_2$, $Si_3N_4$, $Al_2O_3$, and $TiO_x$.

The contact 502 may make contact with the first conductive semiconductor layer 110. For example, the first conductive semiconductor layer 110 may include a GaN layer doped with first conductive impurities, and the contact 502 may make contact with a Ga-face GaN layer. The contact 502 may include a material forming ohmic contact with respect to the first conductive semiconductor layer 110. For example, the contact 502 may include at least one selected from the group consisting of Cr, Ti, and Al.

The dielectric material 503 may include a material having a dielectric property. For example, the dielectric material 503 may include at least one selected from the group consisting of $SiO_2$, $Si_3N_4$, $Al_2O_3$, $TiO_x$, $HfO_x$, BST (Barium strontium titanate), and silicon. The dielectric material 503 may include multi-crystalline silicon or single-crystalline silicon. The multi-crystalline silicon or the single-crystalline silicon may be doped with impurities such as Be, B, N, P, Mg, As, and Sb. The dielectric material 503 may have a thickness of about 1 nm to about 100 nm.

As described above, the capacitor structure prevents the active layer 120 from being damaged due to ESD (Electro-Static Discharge) when the ESD occurs. In other words, if a constant voltage is applied to the light emitting structure layer 135, a current flows to the active layer 120 so that light is emitted due to the recombination of carriers. In addition, when the ESD occurs, energy having a high-frequency component flows to the dielectric substance 503 of the capacitor structure, so the active layer 120 can be protected.

Meanwhile, the conductive support substrate 205 supports the light emitting structure layer 135 and can supply power to the light emitting structure layer 135 together with the electrode unit 115. The conductive support substrate 205 may include at least one selected from the group consisting of copper (Cu), gold (Au), nickel (Ni), molybdenum (Mo), copper-tungsten (Cu—W), and a carrier wafer (including Si, Ge, GaAs, ZnO, or SiC)

The conductive support substrate 205 may have a thickness varying according to the design of the light emitting device 100. For example, the conductive support substrate 205 may have a thickness in the range of 50 μm to 300 μm.

The adhesive layer 204 may be formed on the conductive support substrate 205. The adhesive layer 204 serves as a bonding layer, and is formed below the reflective layer 160, the protective layer 140, the second insulating layer 504, and the dielectric material 503. The adhesive layer 204 makes contact with the reflective layer 160, the ohmic contact layer 150, the second insulating layer 504, and the protective layer 140, such that the reflective layer 160, the ohmic contact layer 150, and the protective layer 140 are firmly bonded to the conductive support substrate 205.

The adhesive layer 204 may include barrier metal or bonding metal. For example, the adhesive layer 204 may include at least one selected from the group consisting of Ti, Au, Sn, Ni, Cr, Ga, In, Bi, Cu, Ag and Ta.

The reflective layer 160 may be formed on the adhesive layer 204. The reflective layer 160 reflects light incident from the light emitting structure layer 135, so that light extraction efficiency can be improved.

The reflective layer 160 may include metal including at least one selected from the group consisting of Ag, Ni, Al, Rh, Pd, Ir, Ru, Mg, Zn, Pt, Au, and Hf, or the alloy thereof. In addition, the reflective layer 160 may be formed in a multiple structure by using the metal or the alloy and transmissive conductive material such as IZO, IZTO, IAZO, IGZO, IGTO, AZO, or ATO. For example, the reflective layer 160 may have a stack structure of IZO/Ni, AZO/Ag, IZO/Ag/Ni, or AZO/Ag/Ni.

According to the embodiment, although a top surface of the reflective layer 150 makes contact with the ohmic contact layer 150, the reflective layer 160 may make contact with the protective layer 140, the current blocking layer 145, the second insulating layer 504, or the light emitting structure layer 135.

The ohmic contact layer 150 may be formed on the reflective layer 160. The ohmic contact layer 150 makes ohmic contact with the second conductive semiconductor layer 130 to allow power to be smoothly supplied to the light emitting structure layer 135. The ohmic contact layer 150 may include at least one of ITO, IZO, IZTO, IAZO, IGZO, IGTO, AZO, and ATO.

In other words, the ohmic contact layer 150 may selectively include a transmissive conductive layer or metal. The ohmic contact layer 150 may be formed in a single layer structure or a multiple layer structure by using at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), $IrO_x$, $RuO_x$, $RuO_x$/ITO, Ni, Ag, Ni/$IrO_x$/Au, and Ni/$IrO_x$/Au/ITO.

According to the embodiment, although the ohmic contact layer 150 makes contact with a bottom surface and a lateral surface of the current blocking layer 145, the ohmic contact layer 150 may be spaced apart from the current blocking layer 145, or may make contact with only the lateral surface of the current blocking layer 145. The ohmic contact layer 150 may be omitted according to embodiments.

The current blocking layer 145 may be interposed between the ohmic contact layer 150 and the second conductive semiconductor layer 130. The top surface of the current blocking layer 145 makes contact with the second conductive semiconductor layer 130, and the bottom surface and the lateral surface of the current blocking layer 145 make contact with the ohmic contact layer 150.

At least a part of the current blocking layer 145 may overlap with the electrode unit 115 perpendicularly to the electrode unit 115. Accordingly, the concentration of a current onto the shortest path between the electrode unit 115 and the conductive support substrate 205 can be reduced, so that the light emission efficiency of the light emitting device 100 can be improved.

The current blocking layer 145 may include a material having electrical conductivity lower than that of a material constituting the reflective layer 160 or the ohmic contact layer 150, a material forming schottky contact with respect to the second conductive semiconductor layer 130, or a material having an electrical insulating property. For example, the current blocking layer 145 may include at least one selected from the group consisting of ITO, IZO, IZTO, IAZO, IGZO, IGTO, AZO, ATO, ZnO, $SiO_2$, $SiO_x$, $SiO_xN_y$, $Si_3N_4$, $Al_2O_3$, $TiO_x$, Ti, Al, and Cr. The current blocking layer 145 may be omitted according to embodiments.

The protective layer 140 may be formed at the outer peripheral portion of the top surface of the adhesive layer 204. In other words, the protective layer 140 may be formed at an outer peripheral portion between the light emitting structure layer 135 and the adhesive layer 204, and may include an electrical insulating material such as ZnO or $SiO_2$. A part of the protective layer 140 overlaps with the light emitting structure layer 135 perpendicularly to the light emitting structure layer 135.

The protective layer 140 increases the lateral surface distance between the adhesive layer 204 and the active layer 120. Accordingly, the protective layer 140 can reduce the possibility of the electrical short between the adhesive layer 204 and the active layer 120.

When an isolation etching process is performed to divide the light emitting structure layer 135 into unit chips in a chip separation process, fragments may be derived from the adhesive layer 204 and attached between the second conductive semiconductor layer 130 and the active layer 120, or between the active layer 120 and the first conductive semiconductor layer 110, thereby causing electrical short therebetween. In this case, the protective layer 140 prevents the electrical short. The protective layer 140 may include a material that is not broken or fragmented in the isolation etching process, or an electrical insulating material that does not cause electrical short even if an extremely less part of the material is broken or fragmented. The protective layer 140 may be omitted according to embodiments.

The light emitting structure layer 135 may be formed on the ohmic contact layer 150 and the protective layer 140.

The lateral surface of the light emitting structure layer 135 may be inclined in the isolation etching process to divide the light emitting structure layer 135 to the unit chips, and a part of the inclined surface overlaps with the protective layer 140 perpendicularly to the protective layer 140.

A part of the top surface of the protective layer 140 may be exposed through the isolation etching process. Accordingly, a part of the protective layer 140 overlaps with the light emitting structure layer 135 perpendicularly to the light emitting structure layer 135, and a remaining part of the protective layer 140 does not overlap with the light emitting structure layer 135.

The light emitting structure layer 135 may include compound semiconductor layers of group III to V elements. For example, the light emitting structure layer 135 may include the first conductive semiconductor layer 110, the active layer 120 below the first conductive semiconductor layer 110, and the second conductive semiconductor layer 130 below the active layer 120.

The first conductive semiconductor layer 110 may include an N type semiconductor layer. The first conductive semiconductor layer 110 may include a semiconductor material having a compositional formula of $In_xAl_yGa_{1-x-y}N$ ($0 \leq x \leq 1$, $0 \leq y \leq 1$, $0 \leq x+y \leq 1$). The first conductive semiconductor layer 110 may be selected from the group consisting of InAlGaN, GaN, AlGaN, AlInN, InGaN, AlN, and InN and may be doped with N type dopants such as Si, Ge, Sn, Se, and Te. The first conductive semiconductor layer 110 may have a single layer structure or a multiple layer structure, but the embodiment is not limited thereto.

The active layer 120 emits the light based on the band gap difference of the energy band according to a material constituting the active layer 120 through the recombination of electrons (or holes) injected through the first conductive semiconductor layer 110 and holes (or electrons) injected through the second conductive semiconductor layer 130.

The active layer 120 may have a single quantum well structure, a multiple quantum well (MQW) structure, a quantum dot structure, or a quantum wire structure, but the embodiment is not limited thereto.

The active layer 120 may include semiconductor material having a compositional formula of $In_xAl_yGa_{1-x-y}N$ ($0 \leq x \leq 1$, $0 \leq y \leq 1$, $0 \leq x+y \leq 1$). If the active layer 120 has the MQW structure, the active layer 120 may have a stack structure of a plurality of well layers and a plurality of barrier layers. For example, the active layer 120 may include a stack structure of InGaN well/GaN barrier layers.

A clad layer (not shown) doped with N type dopants or P type dopants may be formed on and/or below the active layer 120, and the clad layer (not shown) may include an AlGaN layer or an InAlGaN layer.

For example, the second conductive semiconductor layer 130 may include a P type semiconductor layer. The second conductive semiconductor layer 130 may include semiconductor material having a compositional formula of $In_xAl_yGa_{1-x-y}N$ ($0 \leq x \leq 1$, $0 \leq y \leq 1$, $0 \leq x+y \leq 1$). For instance, the second conductive semiconductor layer 130 may be selected from the group consisting of InAlGaN, GaN, AlGaN, InGaN, AlInN, AlN, and InN, and may be doped with P type dopants such as Mg, Zn, Ca, Sr, and Ba.

Meanwhile, the first conductive semiconductor layer 110 may include a P type semiconductor layer, and the second conductive semiconductor layer 130 may include an N type semiconductor layer. In addition, a third conductive semiconductor layer (not shown) including an N type semiconductor layer or a P type semiconductor layer may be formed on the second conductive semiconductor layer 130. Accordingly, the light emitting structure layer may have at least one of NP, PN, NPN, and PNP junction structures. In addition, the doping concentration of impurities in the first and second conductive semiconductor layers 110 and 130 may be uniform or irregular. In other words, the light emitting structure layer may have various structures, and the embodiment is not limited thereto.

The light emitting structure layer including the first conductive semiconductor layer 110, the second conductive semiconductor layer 130, and the active layer 120 may have various modified structures and is not limited to the structure according to the embodiment.

The electrode unit 115 is formed on the light emitting structure layer 135. The electrode unit 115 may include a pad part subject to a wire bonding scheme and an extension part extending from the pad part. The extension part may have various patterns including a predetermined branch pattern.

A roughness or a predetermined pattern 112 may be formed on the top surface of the first conductive semiconductor layer 110. Accordingly, a roughness or a pattern may be formed on the top surface of the electrode unit 115, but the embodiment is not limited thereto.

The passivation layer 180 may be formed on at least a lateral surface of the light emitting structure layer 135. The passivation layer 180 may be formed on top surfaces of the first conductive semiconductor layer 110 and the protective layer 140, but the embodiment is not limited thereto.

The passivation layer 180 may electrically protect the light emitting structure layer 135.

Hereinafter, the method of manufacturing the light emitting device according to the embodiment will be described, and the repeated structures and components will not be further described, or will be briefly described.

FIGS. 2 to 16 are views showing the method of manufacturing the light emitting device according to the embodiment.

Figure 2:
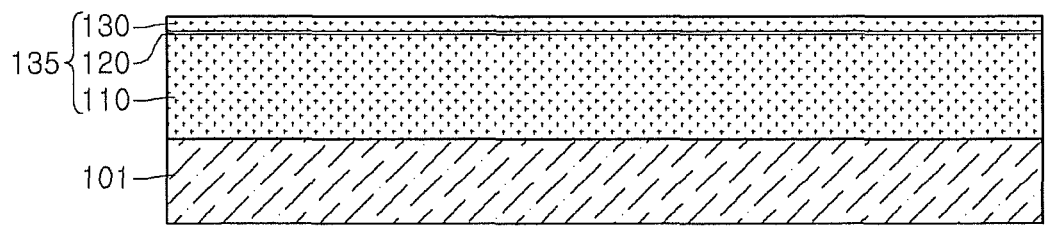
FIGS. 2 to 16 are views showing the method of manufacturing the light emitting device according to the embodiment.

Referring to FIG. 2, the light emitting structure layer 135 is formed on a growth substrate 101. The growth substrate 101 may include at least one selected from the group consisting of sapphire ($Al_2O_3$), SiC, GaAs, GaN, ZnO, Si, GaP, InP, Ge, and $G_2O_3$, but the embodiment is not limited thereto.

The light emitting structure layer 135 may be formed by growing the first conductive semiconductor layer 110, the active layer 120, and the second conductive semiconductor layer 130 from the growth substrate 101, For example, the light emitting structure layer 135 may be formed through MOCVD (Metal Organic Chemical Vapor Deposition), CVD (Chemical Vapor Deposition), PECVD (Plasma-Enhanced Chemical Vapor Deposition), MBE (Molecular Beam Epitaxy), or HVPE (Hydride Vapor Phase Epitaxy), but the embodiment is not limited thereto.

A buffer layer (not shown) and/or an undoped nitride layer (not shown) may be formed between the light emitting structure layer 135 and the growth substrate 101 in order to reduce lattice constant mismatch between the light emitting structure layer 135 and the growth substrate 101.

Figure 3:
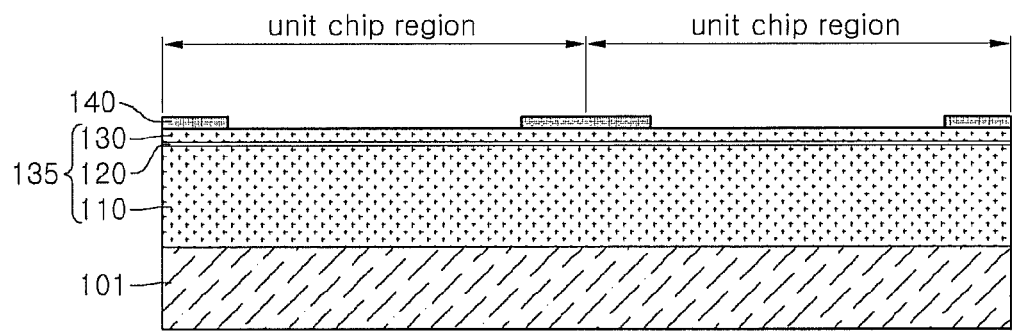

Referring to FIG. 3, the protective layer 140 may be selectively formed on the light emitting structure layer 135 corresponding to the unit chip region.

The protective layer 140 may be formed at an outer peripheral portion of the unit chip region by using a mask pattern. The protective layer 140 may be formed through various deposition schemes such as a sputtering scheme.

Figure 4:
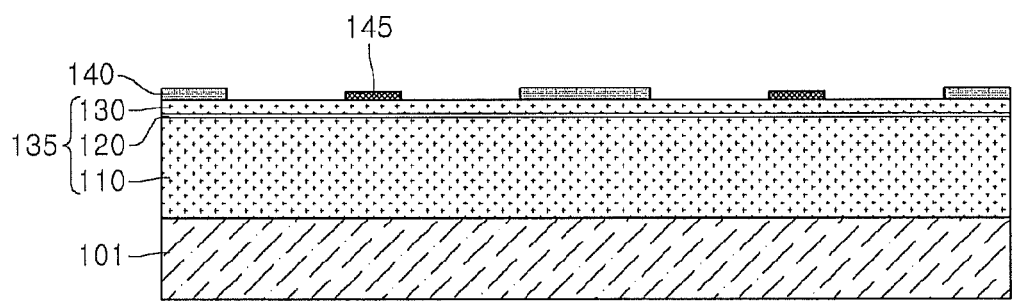

Referring to FIG. 4, the current blocking layer 145 may be formed on the second conductive semiconductor layer 130. The current blocking layer 145 may be formed by using a mask pattern.

The protective layer 140 and the current blocking layer 145 may include the same material. In this case, the protective layer 140 and the current blocking layer 145 are not formed through separate processes, but may be simultaneously formed through one process. For example, after forming a $SiO_2$ layer on the second conductive semiconductor layer 130, the protective layer 140 and the current blocking layer 145 may be simultaneously formed by using a mask pattern.

Figure 5:
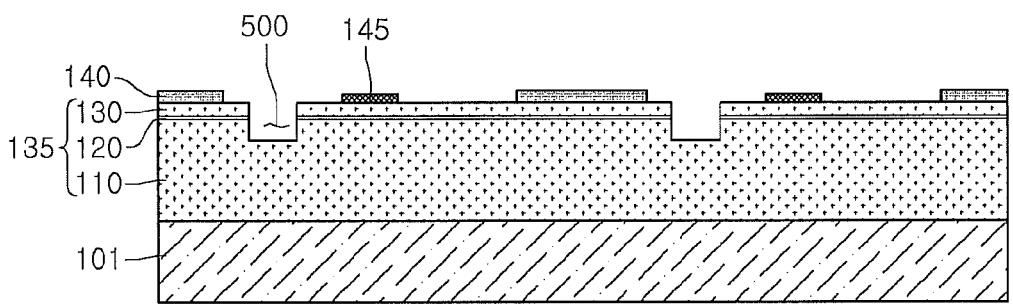

Referring to FIG. 5, a recess part 500 is formed by selectively removing the second conductive semiconductor layer 130, the active layer 120, and the first conductive semiconductor layer 110 so that the first conductive semiconductor layer 110 is exposed.

Figure 6:
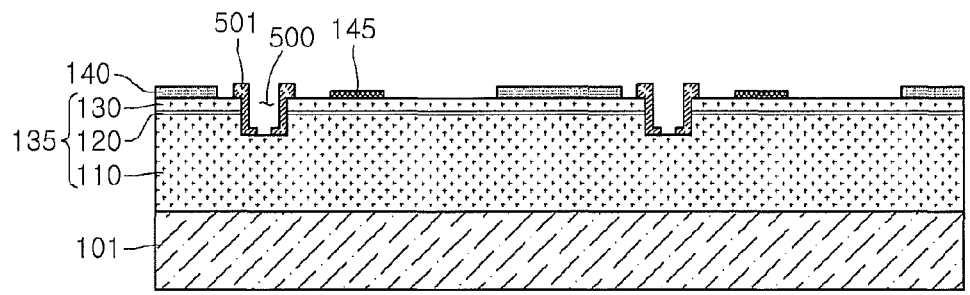

Referring to FIG. 6, the first insulating layer 501 is formed in the recess part 500 in such a manner that the first conductive semiconductor layer 110 is partially exposed. The first insulating layer 501 may be formed in such a manner that the bottom surface of the recess part 500 is partially exposed, and may be partially formed on the top surface of the second conductive semiconductor layer 130.

Figure 7:
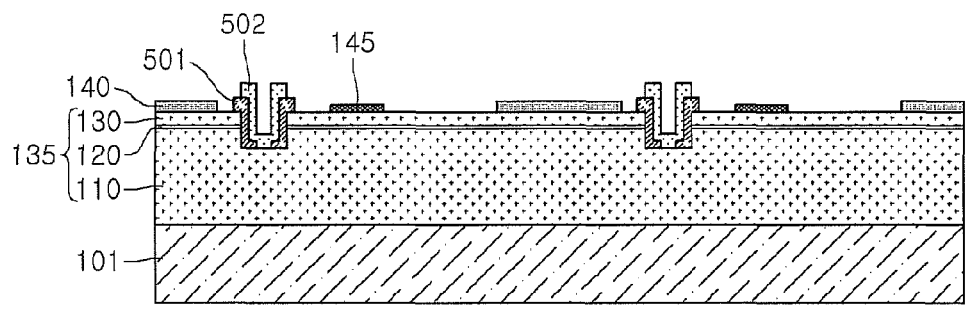

Referring to FIG. 7, the contact 502 is formed in the recess part 500 having the first insulating layer 501. The contact 502 makes contact with the first conductive semiconductor layer 110 and is filled in at least a part of the recess part 500 while making contact with an inner wall of the first insulating layer 501. The contact 502 may be partially formed on a top surface of the first insulating layer 501.

Figure 8:
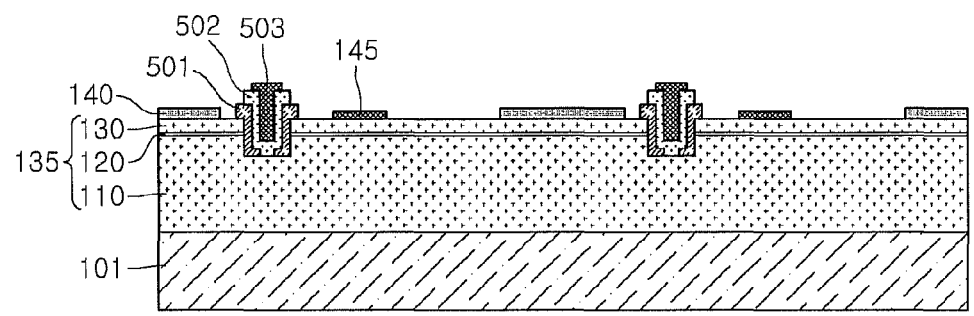

Referring to FIG. 8, the dielectric material 503 is formed while making contact with the contact 502. The dielectric material 503 is filled in the contact 502, and at least a part of the dielectric material 503 may be protrude from an upper portion of the contact 502.

Figure 9:
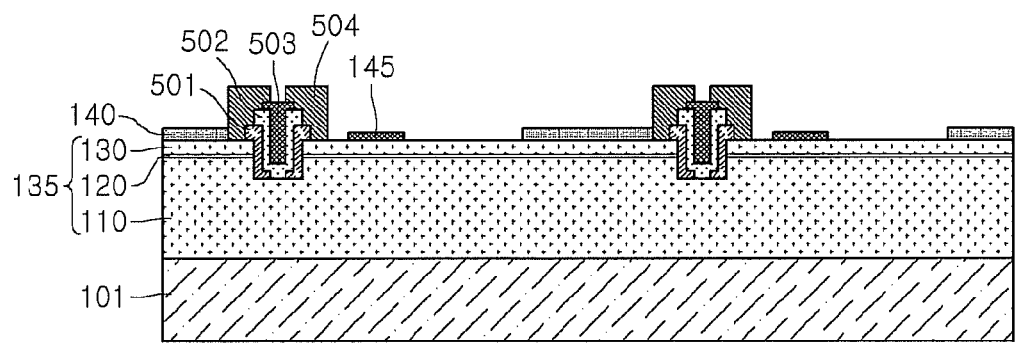

Referring to FIG. 9, the second insulating layer 504 is formed while surrounding the contact 502. The second insulating layer 504 may make contact with the first insulating layer 501 and the dielectric material 503 while surrounding the contact 502 protruding out of the first insulating layer 501.

Figure 10:
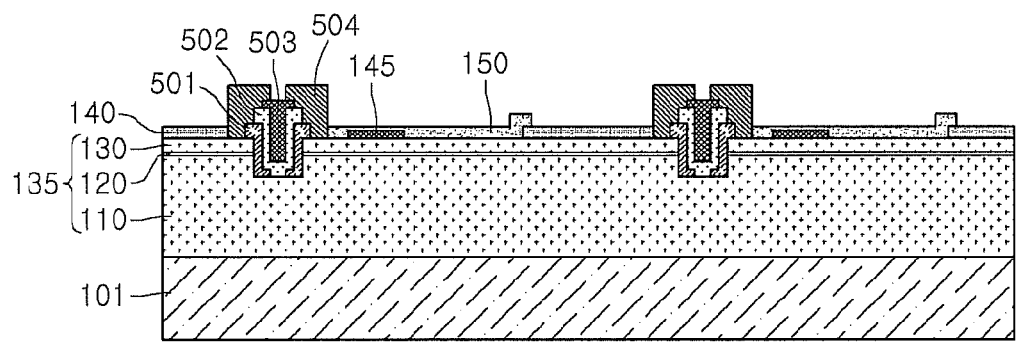
Figure 11:
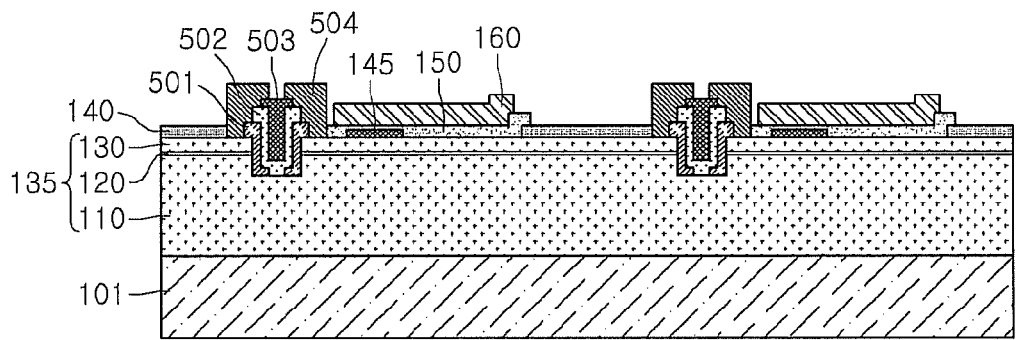

Referring to FIGS. 10 and 11, after forming the ohmic contact layer 150 on the second conductive semiconductor layer 130 and the current blocking layer 145, the reflective layer 160 may be formed on the ohmic contact layer 150.

The ohmic contact layer 150 and the reflective layer 160 may be formed through one of an E-beam deposition scheme, a sputtering scheme, and a PECVD (Plasma Enhanced Chemical Vapor Deposition) scheme.

Figure 12:
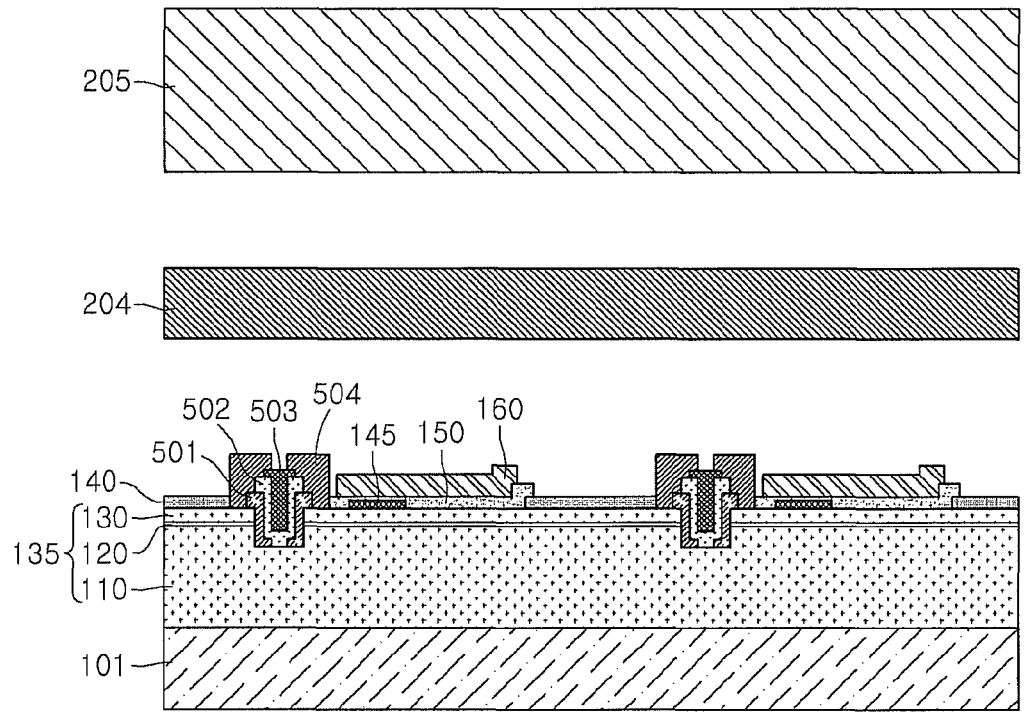
Figure 13:
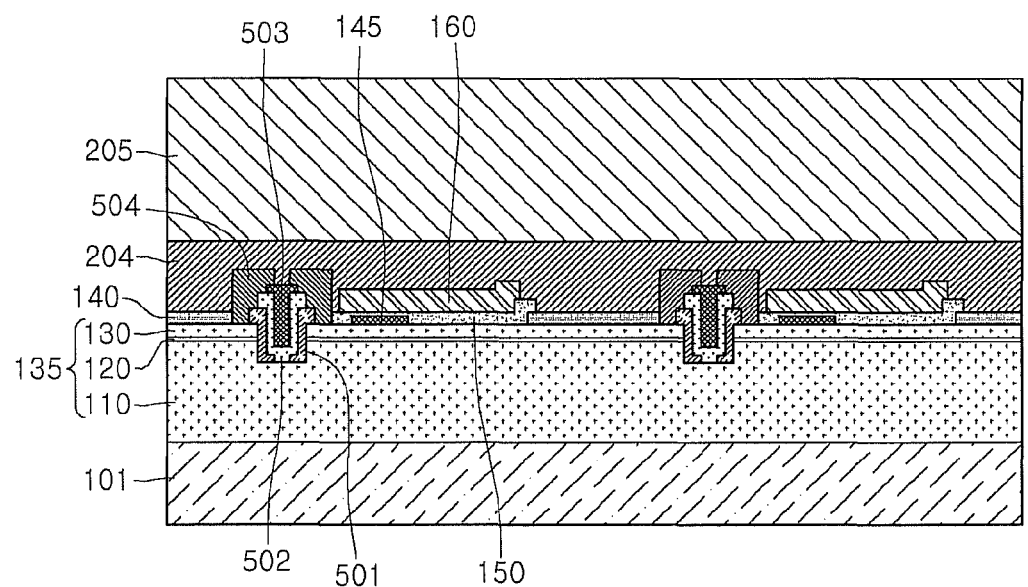

Referring to FIGS. 12 and 13, the conductive support substrate 205 is prepared.

Then, the structure shown in FIG. 11 is bonded to the conductive support substrate 205 through the adhesive layer 204.

The adhesive layer 204 is bonded to the reflective layer 160, an end portion of the ohmic contact layer 150, the second insulating layer 504, and the protective layer 140, so that inter-layer adhesive strength can be enhanced.

The conductive support substrate 205 is bonded through the adhesive layer 204. According to the embodiment, although the conductive support substrate 205 is bonded through a boding scheme using the adhesive layer 204, the conductive support substrate 205 may be bonded through a plating scheme or a deposition scheme without the adhesive layer 204.

Figure 14:
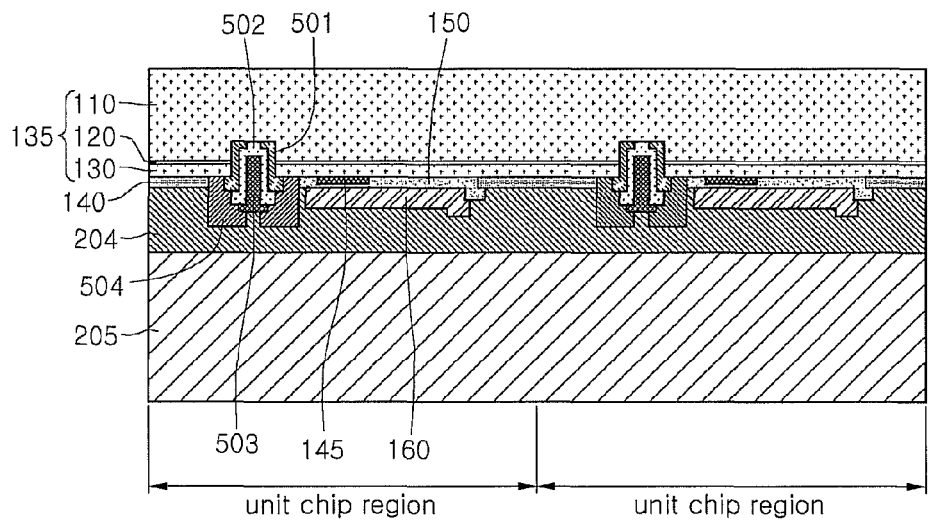

Referring to FIG. 14, the growth substrate 101 is removed from the light emitting structure layer 135. FIG. 14 shows an inverse structure of FIG. 13.

The growth substrate 101 may be removed through a laser lift off scheme or a chemical lift off scheme.

Figure 15:
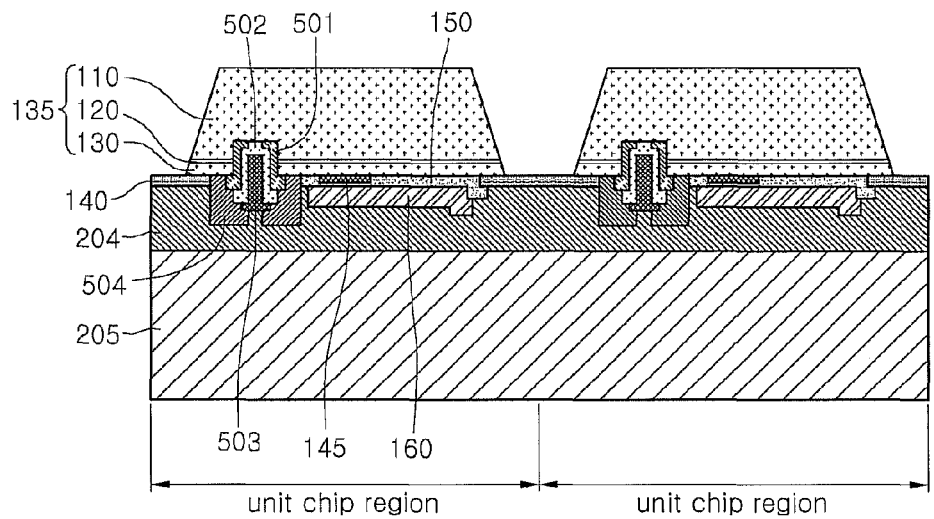

Referring to FIG. 15, the light emitting structure layer 135 is divided into a plurality of light emitting structure layers through an isolation etching process along a unit chip region. For example, the isolation etching process may include a dry etching scheme such as an ICP (Inductively Coupled Plasma) etching scheme.

Figure 16:
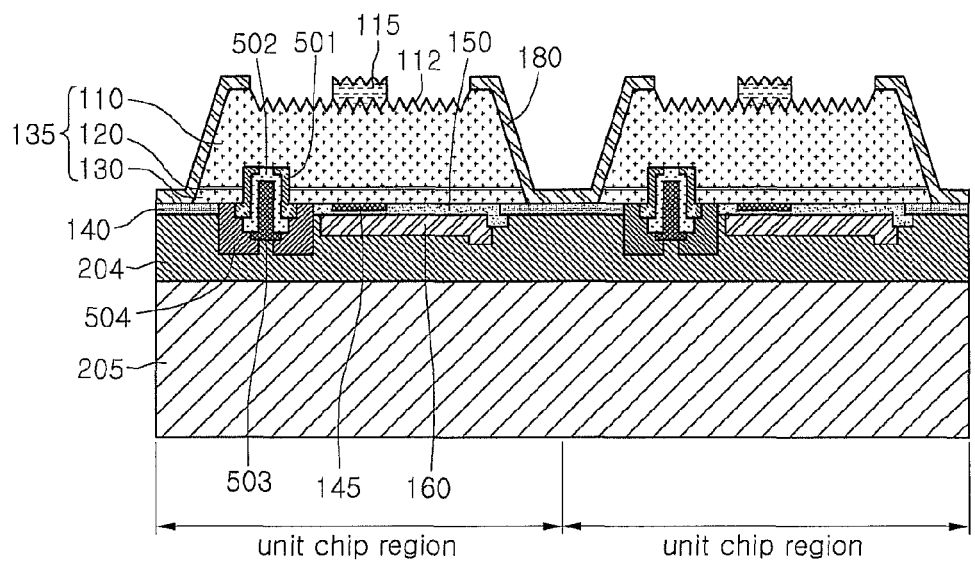

Referring to FIG. 16, after forming the passivation layer 180 on the protective layer 140 and the light emitting structure layer 135, the passivation layer 180 may be selectively removed to expose the top surface of the first conductive semiconductor layer 110.

Then, the roughness or the pattern 112 is formed on the top surface of the first conductive semiconductor layer 110 in order to improve light extraction efficiency, and the electrode unit 115 is formed on the roughness or the pattern 112. The roughness or the pattern 112 may be formed through a wet etching process or a dry etching process.

Next, the structure is divided into unit chip regions through a chip separation process, so that a plurality of light emitting devices 100 can be manufactured.

The chip separation process may include a breaking process to divide chips by applying physical force by using a blade, a laser scribing process to divide chips by irradiating a laser bean into a chip boundary, or an etching process including a wet etching process or a dry etching process, but the embodiment is not limited thereto.

Figure 17:
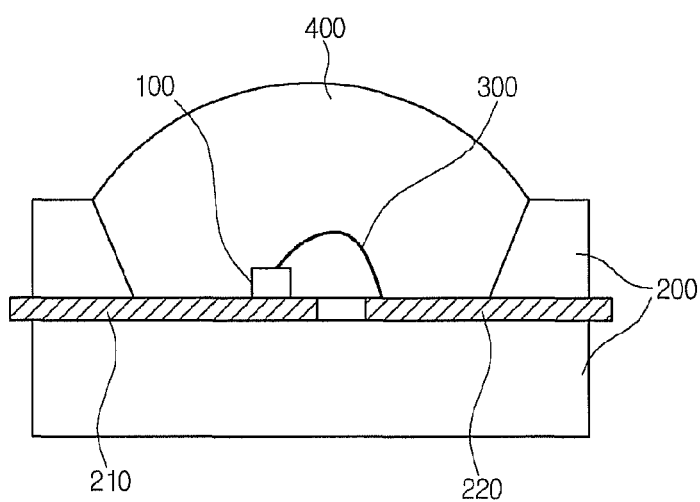
FIG. 17 is a sectional view showing a light emitting device package including the light emitting device according to the embodiment.

FIG. 17 is a view showing a light emitting device package 600 including the light emitting device 100 according to the embodiments.

Referring to FIG. 17, the light emitting device package 600 according to the embodiment includes a body 200, first and second electrodes 210 and 220 formed on the body 200, the light emitting device 100 provided on the body 200 and electrically connected to the first and second electrodes 210 and 220, and a molding member 400 that surrounds the light emitting device 100.

The body 200 may include silicon, synthetic resin or metallic material. An inclined surface may be formed around the light emitting device 100.

The first and second electrodes 210 and 220 are electrically insulated from each other to supply power to the light emitting device 100. In addition, the first and second electrodes 210 and 220 reflect the light emitted from the light emitting device 100 to improve the light efficiency and dissipate heat generated from the light emitting device 100 to the outside.

The light emitting device 100 may be mounted on the body 200 or may be mounted on the first electrode 210 or the second electrode 220.

The light emitting device 100 may be electrically connected to the second electrode 220 through a wire 300. The light emitting device 100 directly makes contact with the first electrode 210 so that the light emitting device 100 may be electrically connected to the first electrode 210.

The molding member 400 surrounds the light emitting device 100 to protect the light emitting device 100. In addition, the molding member 40 may include luminescence material to change the wavelength of the light emitted from the light emitting device 100.

A plurality of light emitting device packages 600 according to the embodiment may be arrayed on a substrate, and an optical member including a light guide plate, a prism sheet, a diffusion sheet, and a fluorescent sheet may be provided on the optical path of the light emitted from the light emitting device package 600. The light emitting device package, the substrate, and the optical member may serve as a backlight unit or a lighting unit. For instance, the lighting system may include a backlight unit, a lighting unit, an indicator, a lamp or a streetlamp.

Figure 18:
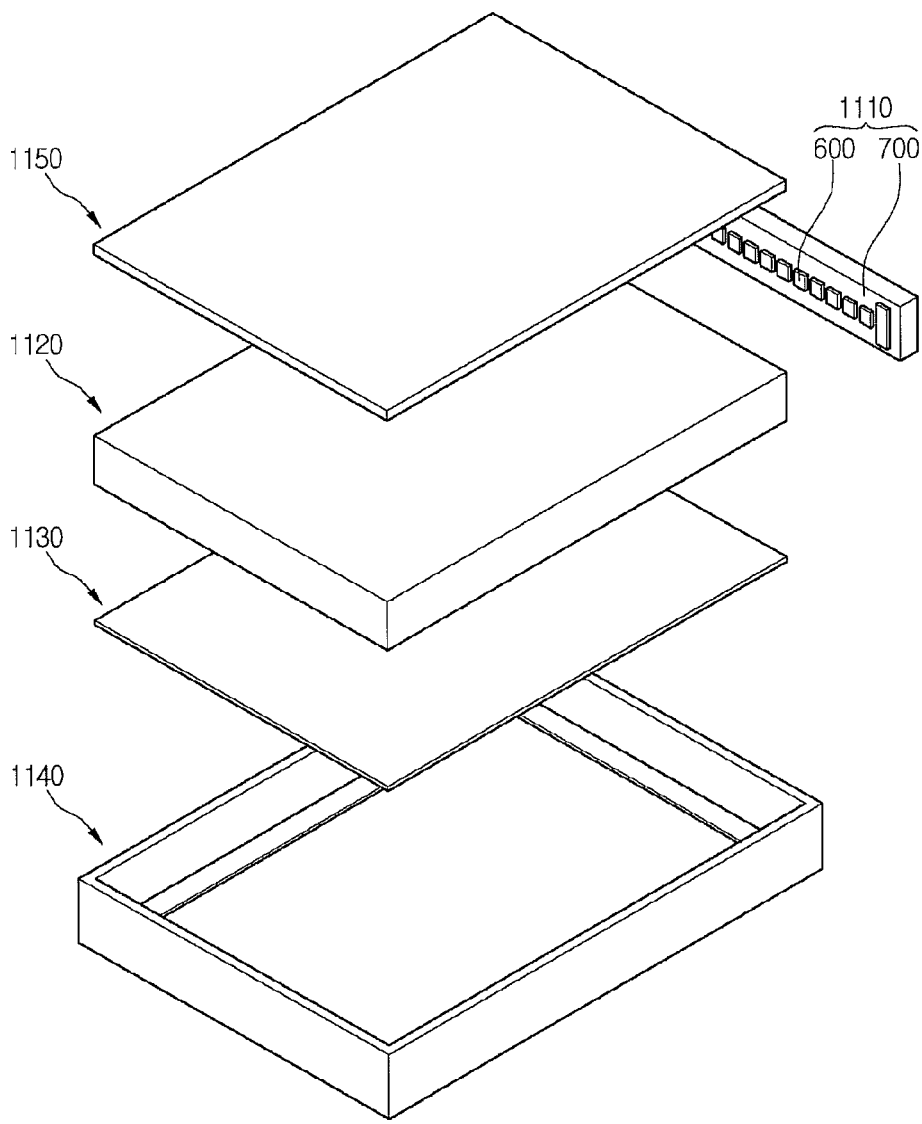
FIG. 18 is a view showing a backlight unit including the light emitting device or the light emitting device package according to the embodiment.

FIG. 18 is a view showing a backlight unit 1100 including the light emitting device or the light emitting device package according to the embodiment. The backlight unit 1100 shown in FIG. 18 is an example of a lighting system, but the embodiment is not limited thereto.

Referring to FIG. 18, the backlight unit 1100 includes a bottom frame 1140, a light guide member 1120 installed in the bottom frame 1140, and a light emitting module 1110 installed at one side or on the bottom surface of the light guide member 1120. In addition, a reflective sheet 1130 is disposed below the light guide member 1120.

The bottom frame 1140 has a box shape having an open top surface to receive the light guide member 1120, the light emitting module 1110 and the reflective sheet 1130 therein. In addition, the bottom frame 1140 may include metallic material or resin material, but the embodiment is not limited thereto.

The light emitting module 1110 may include a substrate 700 and a plurality of light emitting device packages 600 installed on the substrate 700. The light emitting device packages 600 provide the light to the light guide member 1120. According to the light emitting module 1110 of the embodiment, the light emitting device packages 600 are installed on the substrate 700. However, it is also possible to directly install the light emitting device 100 according to the embodiment.

As shown in FIG. 18, the light emitting module 1110 is installed on at least one inner side of the bottom frame 1140 to provide the light to at least one side of the light guide member 1120.

In addition, the light emitting module 1110 can be provided below the bottom frame 1140 to provide the light toward the bottom surface of the light guide member 1120. Such an arrangement can be variously changed according to the design of the backlight unit 1100, but the embodiment is not limited thereto.

The light guide member 1120 is installed in the bottom frame 1140. The light guide member 1120 converts the light emitted from the light emitting module 1110 into the surface light to guide the surface light toward a display panel (not shown).

The light guide member 1120 may include a light guide plate. For instance, the light guide plate can be manufactured by using acryl-based resin, such as PMMA (polymethyl methacrylate), PET (polyethylene terephthalate), PC (polycarbonate), COC or PEN (polyethylene naphthalate) resin.

An optical sheet 1150 may be provided over the light guide member 1120.

The optical sheet 1150 may include at least one of a diffusion sheet, a light collection sheet, a brightness enhancement sheet, and a fluorescent sheet. For instance, the optical sheet 1150 has a stack structure of the diffusion sheet, the light collection sheet, the brightness enhancement sheet, and the fluorescent sheet. In this case, the diffusion sheet uniformly diffuses the light emitted from the light emitting module 1110 such that the diffused light can be collected on the display panel (not shown) by the light collection sheet. The light output from the light collection sheet is randomly polarized and the brightness enhancement sheet increases the degree of polarization of the light output from the light collection sheet. The light collection sheet may include a horizontal and/or vertical prism sheet. In addition, the brightness enhancement sheet may include a dual brightness enhancement film and the fluorescent sheet may include a transmissive plate or a transmissive film including luminescence material.

The reflective sheet 1130 can be disposed below the light guide member 1120. The reflective sheet 1130 reflects the light, which is emitted through the bottom surface of the light guide member 1120, toward the light exit surface of the light guide member 1120.

The reflective sheet 1130 may include resin material having high reflectivity, such as PET, PC or PVC resin, but the embodiment is not limited thereto.

Figure 19:
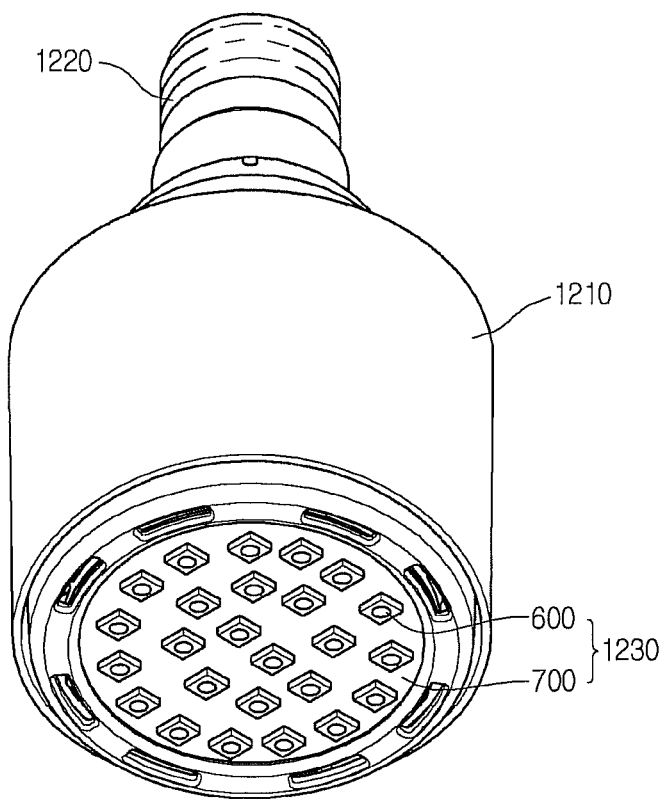
FIG. 19 is a lighting unit including the light emitting device or the light emitting device package according to the embodiment.

FIG. 19 is a perspective view showing a lighting unit 1200 including the light emitting device or the light emitting device package according to the embodiment. The lighting unit 1200 shown in FIG. 19 is an example of a lighting system and the embodiment is not limited thereto.

Referring to FIG. 19, the lighting unit 1200 includes a case body 1210, a light emitting module 1230 installed in the case body 1210, and a connection terminal 1220 installed in the case body 1210 to receive power from an external power source.

Preferably, the case body 1210 includes material having superior heat dissipation property. For instance, the case body 1210 includes metallic material or resin material.

The light emitting module 1230 may include a substrate 700 and at least one light emitting device package 600 installed on the substrate 700. In the light emitting module 1230 according to the embodiment, the light emitting device package 600 is installed on the substrate 700. However, it is also possible to directly install the light emitting device 100 according to the embodiment.

The substrate 700 includes an insulating member printed with a circuit pattern. For instance, the substrate 700 includes a PCB (printed circuit board), an MC (metal core) PCB, a flexible PCB, or a ceramic PCB.

In addition, the substrate 700 may include material that effectively reflects the light. The surface of the substrate 700 can be coated with a color, such as a white color or a silver color, to effectively reflect the light.

At least one light emitting device package 600 according to the embodiment can be installed on the substrate 700. Each light emitting device package 600 may include at least one LED (light emitting diode). The LED may include a colored LED that emits the light having the color of red, green, blue or white and a UV (ultraviolet) LED that emits UV light.

The LEDs of the light emitting module 1230 can be variously arranged to provide various colors and brightness. For instance, the white LED, the red LED and the green LED can be arranged to achieve the high color rendering index (CRI). In addition, a fluorescent sheet can be provided in the path of the light emitted from the light emitting module 1230 to change the wavelength of the light emitted from the light emitting module 1230. For instance, if the light emitted from the light emitting module 1230 has a wavelength band of blue light, the fluorescent sheet may include yellow luminescent material. In this case, the light emitted from the light emitting module 1230 passes through the fluorescent sheet so that the light is viewed as white light.

The connection terminal 1220 is electrically connected to the light emitting module 1230 to supply power to the light emitting module 1230. Referring to FIG. 19, the connection terminal 1220 has a shape of a socket screw-coupled with the external power source, but the embodiment is not limited thereto. For instance, the connection terminal 1220 can be prepared in the form of a pin inserted into the external power source or connected to the external power source through a wire.

According to the lighting system as described above, at least one of the light guide member, the diffusion sheet, the light collection sheet, the brightness enhancement sheet and the fluorescent sheet is provided in the path of the light emitted from the light emitting module, so that the desired optical effect can be achieved.

As described above, the lighting system includes the light emitting device or the light emitting device package representing superior electrical stability so that superior electrical reliability can be represented.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a conductive substrate;
   a dielectric layer over the conductive substrate;
   a light emitting structure above the dielectric layer, wherein the light emitting structure comprises a first conductive semiconductor layer, a second conductive semiconductor layer, and an active layer between the first conductive semiconductor layer and the second conductive semiconductor layer;
   a contact layer between the light emitting structure and the dielectric layer,
   an insulating layer between the contact layer and the light emitting structure,
   wherein the contact layer comprises a first protrusion penetrating into a portion of the light emitting structure, wherein the first protrusion of the contact layer extends into a portion of the first conductive semiconductor layer through the second conductive semiconductor layer and the active layer, and wherein:
   a top surface of the first protrusion of the contact layer is in direct contact with the portion of the first conductive semiconductor layer,
   the dielectric layer comprises a second protrusion which extends into the light emitting structure,
   the second protrusion of the dielectric layer is in direct contact with the first protrusion of the contact layer, and the insulating layer is disposed between the first protrusion of the contact layer and the light emitting structure.

2. The light emitting device of claim 1, wherein the first protrusion of the contact layer physically contacts the first conductive semiconductor layer.

3. The light emitting device of claim 1, wherein the contact layer physically contacts the dielectric layer.

4. The light emitting device of claim 1, wherein the light emitting structure is physically separated from the dielectric layer by the contact layer.

5. The light emitting device of claim 1, further comprising an electrode over a top side of the light emitting structure layer, and wherein the conductive substrate is disposed adjacent a bottom side of the light emitting structure layer.

6. The light emitting device of claim 5, wherein the contact layer does not vertically overlap with the electrode.

7. The light emitting device of claim 5, wherein the dielectric layer does not vertically overlap with the electrode.

8. The light emitting device of claim 1, wherein the conductive substrate, the dielectric layer and the contact layer vertically overlap each other.

9. The light emitting device of claim 1, wherein the conductive substrate, the dielectric layer and the contact layer are sequentially vertically stacked.

10. The light emitting device of claim 1, wherein the insulating layer comprises:
    a first insulating layer between the contact layer and at least one of the second conductive semiconductor layer or the active layer; and
    a second insulating layer between the contact layer and the conductive substrate.

11. The light emitting device of claim 1, wherein the insulating layer includes at least one selected from the group consisting of $SiO_2$, $Si_3N_4$, $Al_2O_3$, and $TiO_x$.

12. The light emitting device of claim 1, wherein the insulating layer physically contacts the contact layer.

13. The light emitting device of claim 1, wherein the contact layer is located around at least a portion of a lateral surface of at least a part of the dielectric layer.

14. The light emitting device of claim 1, wherein the contact layer comprises an electrically conductive material.

15. The light emitting device of claim 1, wherein the dielectric layer comprises at least one selected from the group consisting of $SiO_2$, $Si_3N_4$, $Al_2O_3$, $TiO_x$, $HfO_x$, and BST (Barium strontium titanate).

16. The light emitting device of claim 1, wherein the dielectric layer is doped with impurities.

17. The light emitting device of claim 1, further comprising
    a protective layer at an outer peripheral portion of the conductive substrate,
    wherein the protective layer is disposed below a bottom of the light emitting structure.

18. The light emitting device of claim 17, wherein the protective layer comprises an electrically insulating material.

* * * * *